United States Patent [19]
Fujimura

[11] Patent Number: 5,897,376
[45] Date of Patent: Apr. 27, 1999

[54] METHOD OF MANUFACTURING A SEMICONDUCTOR DEVICE HAVING A REFLECTION REDUCING FILM

[75] Inventor: Takashi Fujimura, Chiba, Japan

[73] Assignee: Seiko Instruments Inc., Japan

[21] Appl. No.: 08/551,370

[22] Filed: Nov. 1, 1995

Related U.S. Application Data

[62] Division of application No. 08/306,364, Sep. 15, 1994, abandoned.

[30] Foreign Application Priority Data

Sep. 20, 1993 [JP] Japan .................................. 5-233598

[51] Int. Cl.[6] .................................................... H01L 21/00
[52] U.S. Cl. ......................... 438/694; 257/760; 257/774; 257/915
[58] Field of Search .................................. 257/774, 760, 257/915; 437/225, 228; 438/694

[56] References Cited

U.S. PATENT DOCUMENTS

| | | | |
|---|---|---|---|
| 4,592,132 | 6/1986 | Lee et al. | 257/760 |
| 4,618,878 | 10/1986 | Aoyama et al. | 257/760 |
| 4,723,197 | 2/1988 | Takiar et al. | 257/760 |
| 4,808,552 | 2/1989 | Anderson | 257/760 |
| 4,884,120 | 11/1989 | Mochizuki et al. | 257/760 |
| 5,278,448 | 1/1994 | Fujii | 257/774 |
| 5,281,850 | 1/1994 | Kanamori | 257/915 |
| 5,317,193 | 5/1994 | Watanabe | 257/774 |
| 5,319,246 | 6/1994 | Nagamine et al. | 257/774 |
| 5,323,047 | 6/1994 | Nguyen | 257/774 |

FOREIGN PATENT DOCUMENTS

| | | | |
|---|---|---|---|
| 0171758 | 7/1991 | Japan | 257/760 |
| 0175635 | 7/1991 | Japan | 257/760 |
| 0243151 | 8/1992 | Japan | 257/760 |
| 0089893 | 3/1994 | Japan | 257/760 |

*Primary Examiner*—Ceila Chang
*Attorney, Agent, or Firm*—Adams & Wilks

[57] ABSTRACT

A method of manufacturing a semiconductor device includes forming a reflection reducing film on a film having a high reflectance and forming a photoresist on the first reflection reducing film. When the photoresist is patterned by selectively exposing the photoresist to an exposure light through a photomask by photolithography technology, the photoresist is not exposed by a light reflected by the film having high reflectance, thereby allowing a pattern of the photoresist to be formed which corresponds to the photomask.

22 Claims, 3 Drawing Sheets

METHOD OF MANUFACTURING A SEMICONDUCTOR DEVICE HAVING A REFLECTION REDUCING FILM

This is a divison of application Ser. No. 08/306,364 filed Sep. 15, 1994 now abandoned.

BACKGROUND OF THE INVENTION

The present invention relates to a semiconductor device which has a film having high reflectance deposited under an insulating film.

Conventionally, as shown in FIG. 2, in order to make a contact hole on an insulating film 2 formed on a film 1 having high reflectance, a photoresist 4 is applied on the insulating film 2, a thin mask pattern 5 is photolithographed on the photoresist 4 by photolithography technology using a photomask 6 to pattern the photoresist 4, and then the insulating film 2 is etched by using the photoresist patterned 4 as a mask.

In the above method, when the photoresist 4 on the insulating film 2 is patterned by photolithography technology, an exposure light 7 penetrates the photoresist 4 and the insulating film 2 and is reflected by the film 1 having high reflectance under the insulating film 2. A light 8 reflected by the film 1 having high reflectance exposes a part of the photoresist 4 that should not be originally exposed, which results in the formation of a pattern of the photoresist 4 that does not correspond to the pattern of the photomask 6 used to pattern the photoresist 4.

SUMMARY OF THE INVENTION

An object of the present invention is to provide a semiconductor device having a reflection reducing film.

Another object of the present invention is to provide a semiconductor device having a insulating film and a reflection reducing film disposed between a first wiring and a second wiring.

Still another object of the present invention is to provide a manufacturing method for a semiconductor device having a reflection reducing film.

In the present invention, in order to solve the above problem, on a substrate is formed a thin film having a high reflectance of 50% or more with regard to exposure light in a photolithography step that will come later; on the thin film having a high reflectance is formed a first reflection reducing film having a reflectance of 30% or less with regard to the exposure light in the photolithography step. After the photolithography step and an etching step, the film having a high reflectance and the first reflection reducing film are selectively patterned. Then, the first reflection reducing film is removed. After removal of the first reflection reducing film, on the film having high reflectance is formed an inter-layer insulating film that has a transmittance of 60% or more with regard to exposure light in a second photolithography step. Then, on the inter-layer insulating film is provided a second reflection reducing film that has a reflectance of 30% or less with regard to the exposure light in the second photolithography step. After the photolithography step and the etching step, the inter-layer insulating film is patterned.

In the present invention, the reflection reducing film is provided on the insulating film, so that an amount of light reflected by the film having a high reflectance under the film is decreased in the photolithography step for making a contact hole on the insulating film, and a photoresist is not exposed by the light reflected by the film having a high reflectance, thereby forming a pattern faithful to the photomask over the photoresist.

DETAILED DESCRIPTION OF THE PREFERRED EMBODIMENT

Figure 1:
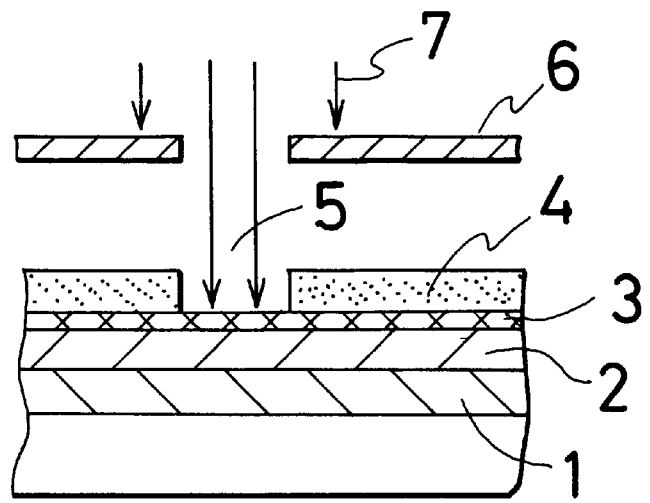
FIG. 1 is a sectional view showing an embodiment of the present invention.
Figure 2:
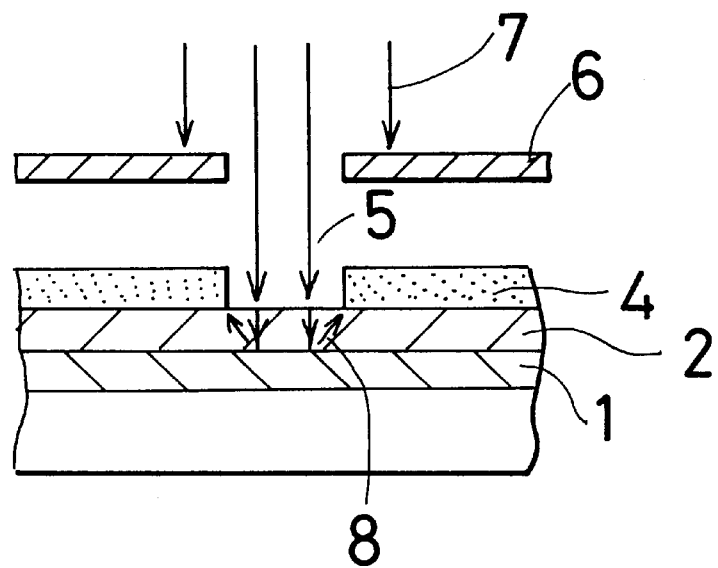
FIG. 2 is a sectional view showing a semiconductor device of the prior art.

Hereinafter, an embodiment of the present invention will be explained referring to the drawings. FIG. 1 shows an embodiment of the present invention in which a semiconductor device comprises an insulating film 2 formed on a film 1 having a high reflectance 1, and a reflection reducing film 3 formed on the insulating film 2. In order to form an opening for a contact hole on the insulating film 2, a photoresist 4 is applied on the reflection reducing film 3, and a pattern of a mask 6 is photolithographed on the photoresist 4 by photolithography technology. At that time, due to the reflection reducing film 3, an exposure light 7 is not reflected by the film 1 having a high reflectance provided under the insulating film 2, so that it does not photosense the photoresist 4. As a result, a pattern corresponding to the mask 6 can be photolithographed on the photoresist 4.

Detailed embodiments of the manufacturing method according to the present invention will be explained referring to the drawings.

FIGS. 3A–3I show a manufacturing process according to the invention.

Figure 3A:
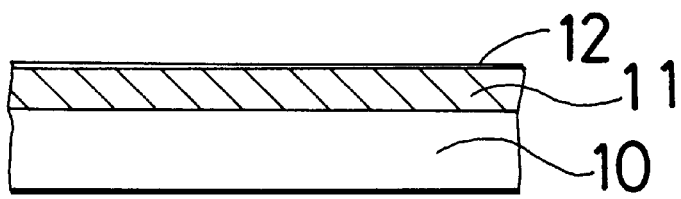
FIGS. 3A–3I are explanatory sectional views showing the manufacturing process of the invention.
Figure 3B:
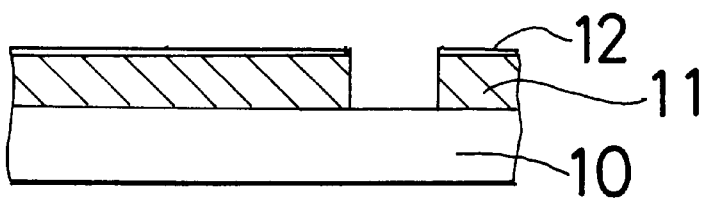
Figure 3C:
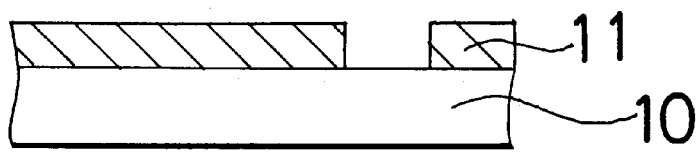

A first aluminum film 11 is formed on a substrate or device layer 10 by 2 for example sputtering (FIG. 3A). The first aluminum film 11 is a thin film that has a high reflectance of 50% or more with regard to an exposure light such as g-line light($\lambda$=436 nm) and an i-line light($\lambda$=365 nm) of mercury lamp, eximer laser and x-rays in the first photolithography step. A titanium nitride film of 10 to 1000 Å in thickness as a first reflection reducing film 12 is formed on the first aluminum film 11 by sputtering (FIG. 3A). The first reflection reducing film 12 is a film that has a reflectance of 30% or less with regard to an exposure light such as g-line light ($\lambda$=436 nm) and i-line light ($\lambda$=365 nm) of mercury lamp, eximer laser and x-rays in the first photolithography step. The photoresist is applied on the first reflection reducing film 12, and the photoresist is exposed through the mask, thereby being selectively patterned (FIG. 3B). The first reflection reducing film 12 and the first aluminum film 11 are etched by using the patterned photoresist as a mask. After the etching process, the photoresist is flaked and all of the first reflection reducing film 12 on the first aluminum film 11 is removed by etching (FIG. 3C).

Figure 3D:
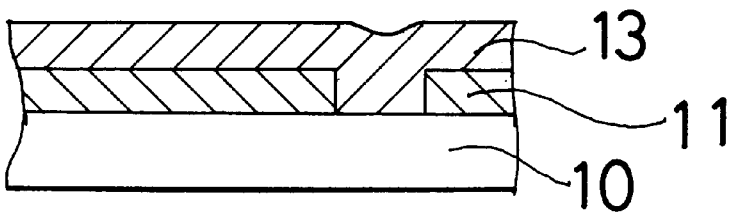
Figure 3E:
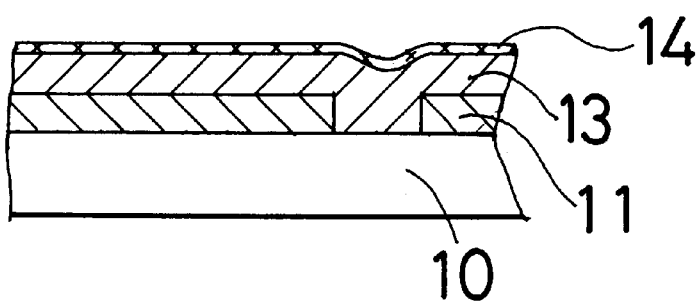
Figure 3F:
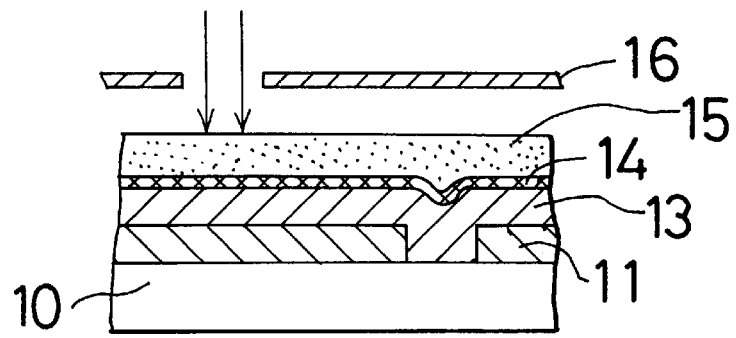
Figure 3G:
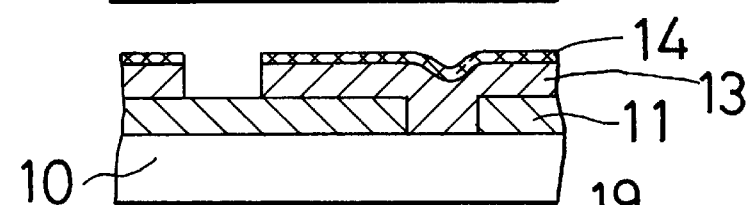

After removing the first reflection reducing film 12, an interlayer insulating film 13 is deposited by CVD (FIG. 3D). The interlayer insulating film 13 is a film that has a transmittance of 60% or more with regard to an exposure light such as g-line light ($\lambda$=436 nm) and i-line light ($\lambda$=365 nm) of mercury lamp, eximer laser, and X-ray in a second photolithography step. For instance, the interlayer insulating film 13 is preferably one of $SiO_2$, SiON, PSG and BPSG. A titanium nitride film of 10 to 1000 Å in thickness as a second reflection reducing film 14 is formed on the interlayer insulating film 13 by sputtering (FIG. 3E). The second reflection reducing film 14 is a film having a reflectance of 30% or less with regard to an exposure light such as g-line light (λ=436 nm) and i-line light (λ=365 nm) of mercury lamp, eximer laser, and x-ray in the second photolithography step. A photoresist 15 is applied on the second reflection reducing film 14, and is exposed to an exposure light 17 through mask 16 to pattern the photoresist 15 selectively (FIG. 3F). The second reflection reducing film 14 and the interlayer insulating film 13 are etched by using the patterned photoresist 15 as a mask to mask an opening section of a contact hole selectively (FIG. 3G). After etching, the photoresist film 15 on the second reflection reducing film 14 is flaked.

Figure 3H:
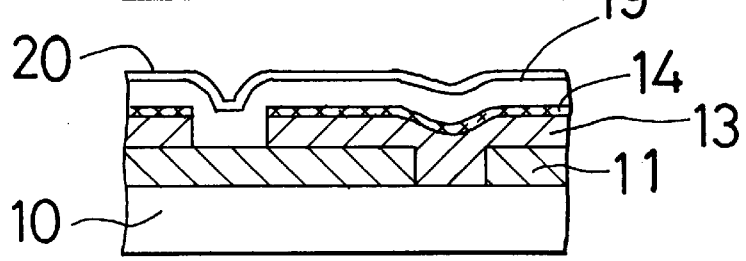
Figure 3I:
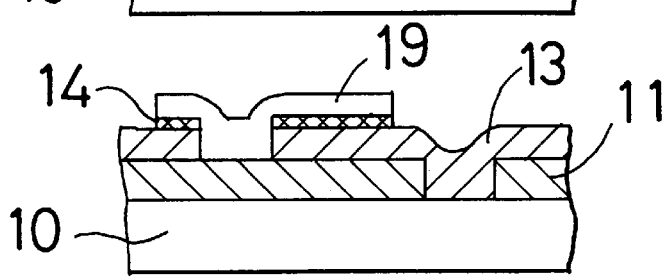

A second aluminum film 19 is formed on the second reflection reducing film 14 by sputtering (FIG. 3H). On the second aluminum film 19 is formed a titanium nitride film of 10 to 1000 Å in thickness as a third reflection reducing film 20. A photoresist is applied on the third reflection reducing film 20 and is exposed through a mask to pattern the photoresist film selectively. The third reflection reducing film 20, the second aluminum film 19 and the second reflection reducing film 14 are etched by using the photoresist film as a mask (FIG. 3I). After etching, the photoresist film is flaked.

As mentioned above, in this embodiment the reflection reducing film 14 is provided on the interlayer insulating film 13, so that the exposure light 17 in the photolithography step does not penetrate the interlayer insulating film 13 and is not reflected by the first aluminum film 11 under the interlayer insulating film 13. Therefore, the photoresist 15 is not locally exposed and the pattern corresponding to the mask can be photolithographed on the photoresist 15.

Further, in this embodiment, through the second reflection reducing film 14 on the interlayer insulating film 13 is etched at the same time the second aluminum film 19 is etched, it is not necessary to etch the second reflection reducing film 14 when the second aluminum film is made of an insulating film such as amorphous silicon and nitride.

Furthermore, though in this embodiment the first and second aluminum films 11 and 19 are used for explanation as a wiring and an electrode, a polysilicon film or silicide film can be used instead.

In the present invention, as explained above, a reflection reducing film is formed on an oxide film, so that an amount of light reflected by the film having high reflectance under the oxide film can be reduced below 40% in a photolithography step for making a contact hole on the oxide film. Therefore, the photoresist is not photosensed by the light reflected by the film having high reflectance, and a part of the photoresist that should not be originally exposed is kept from being exposed. As a result, a pattern corresponding to the mask can be photolithographed on the photoresist.

What is claimed is:

1. A method of manufacturing a semiconductor device, comprising the steps of:

forming a thin film having a high reflectance of 50% or more with respect to an exposure light;

forming on the thin film a first reflection reducing film having a reflectance of 30% or less with respect to the exposure light;

forming a first photoresist on the first reflection reducing film;

patterning the first photoresist by selectively exposing the first photoresist to the exposure light through a first photomask;

etching the first reflection reducing film and the thin film using the first photoresist as a mask;

removing the first photoresist;

removing the first reflection reducing film;

forming on the thin film an interlayer insulating film having a transmittance of 60% or more with respect to the exposure light;

forming on the interlayer insulating film a second reflection reducing film having a reflectance of 30% or less with respect to the exposure light forming a second photoresist on the second reflection reducing film;

patterning the second photoresist by selectively exposing the second photoresist to the exposure light through a second photomask; and etching the second reflection reducing film and the interlayer insulating film using the second photoresist as a mask.

2. A method of manufacturing a semiconductor device according to claim 1; further comprising the step of removing the second reflection reducing film.

3. A method of manufacturing a semiconductor device according to claim 2; wherein the thin film is selected from the group consisting of aluminum, polysilicon and silicide.

4. A method of manufacturing a semiconductor device according to claim 2; wherein the interlayer insulating film is selected from the group consisting of amorphous silicon, nitride, $SiO_2$, SiON, PSG and BPSG.

5. A method of manufacturing a semiconductor device according to claim 2; wherein the first and second reflection reducing films are titanium nitride films.

6. A method of manufacturing a semiconductor device according to claim 1; wherein the thin film is selected from the group consisting of aluminum, polysilicon and silicide.

7. A method of manufacturing a semiconductor device according to claim 1; wherein the interlayer insulating film is selected from the group consisting of amorphous silicon, nitride, $SiO_2$, SiON, PSG and BPSG.

8. A method of manufacturing a semiconductor device according to claim 1; wherein the first and second reflection reducing films are titanium nitride films.

9. A method of manufacturing a semiconductor device, comprising the steps of:

providing a substrate;

forming on the substrate a first film having a reflectance of 50% or more with respect to an exposure light;

forming on the first film a first reflection reducing film having a reflectance of 30% or less with respect to the exposure light;

forming a first photoresist on the first reflection reducing film;

patterning the first photoresist by selectively exposing the first photoresist to the exposure light through a photomask;

etching the first reflection reducing film and the first film using the first photoresist as a mask;

removing the first photoresist;

removing the first reflection reducing film;

forming on the thin film an interlayer insulating film having a transmittance of 60% or more with respect to the exposure light;

forming on the interlayer insulating film a second reflection reducing film having a reflectance of 30% or less with respect to the exposure light;

forming a second photoresist on the second reflection reducing film;

patterning the second photoresist by selectively exposing the second photoresist to the exposure light through a photomask; and etching the second reflection reducing film and the interlayer insulating film using the second photoresist as a mask.

10. A method of manufacturing a semiconductor device according to claim 9; further comprising the steps of forming on the second reflection reducing film a second film having a high reflectance; forming a third reflection reducing film on the second film; forming a third photoresist on the third reflection reducing film; patterning the third photoresist by selectively exposing the third photoresist to the exposure light through a photomask; and etching the third reflection reducing film, the second film and the second reflection reducing film using the photoresist as a mask.

11. A method of manufacturing a semiconductor device according to claim 10; wherein the first and second films are selected from the group consisting of aluminum, polysilicon and silicide.

12. A method of manufacturing a semiconductor device according to claim 10; wherein the first, second and third reflection reducing films are titanium nitride films.

13. A method of manufacturing a semiconductor device according to claim 10; further comprising the steps of removing the third photoresist; and removing the third reflection reducing film.

14. A method of manufacturing a semiconductor device according to claim 9; wherein the interlayer insulating film is selected from the group consisting of amorphous silicon, nitride, $SiO_2$, SiON, PSG and BPSG.

15. A method of manufacturing a semiconductor device according to claim 9; wherein the first and second reflection reducing films are titanium nitride films.

16. A method of manufacturing a semiconductor device, comprising the steps of:

forming a thin film having a high reflectance of 50% or more with respect to an exposure light;

forming on the thin film a first reflection reducing film having a reflectance of 30% or less with respect to the exposure light;

etching the first reflection reducing film and the thin film;

removing the first reflection reducing film;

forming on the thin film an interlayer insulating film having a transmittance of 60% or more with respect to the exposure light;

forming on the interlayer insulating film a second reflection reducing film having a reflectance of 30% or less with respect to the exposure light; and etching the second reflection reducing film and the interlayer insulating film.

17. A method of manufacturing a semiconductor device according to claim 16; further comprising the steps of forming on the second reflection reducing film a thin aluminum film, forming on the thin aluminum film a third reflection reducing film, and etching the second reflection reducing film, the thin aluminum film and the third reflection reducing film.

18. A method of manufacturing a semiconductor device according to claim 17; wherein the first, second and third reflection reducing films are titanium nitride films.

19. A method of manufacturing a semiconductor device according to claim 17; wherein the thin film having a high reflectance of 50% or more with respect to an exposure light comprises an aluminum film.

20. A method of manufacturing a semiconductor device according to claim 16; wherein the thin film is comprised of a material selected from the group consisting of aluminum, polysilicon and silicide.

21. A method of manufacturing a semiconductor device according to claim 16; wherein the interlayer insulating film is comprised of a material selected from the group consisting of amorphous silicon, nitride, $SiO_2$, SiON, PSG and BPSG.

22. A method of manufacturing a semiconductor device according to claim 16; wherein the first and second reflection reducing films are titanium nitride film.

* * * * *